US010548225B2

(12) United States Patent
Lee et al.

(10) Patent No.: US 10,548,225 B2
(45) Date of Patent: Jan. 28, 2020

(54) FLEXIBLE PRINTED CIRCUIT AND DISPLAY DEVICE

(71) Applicant: Samsung Display Co., Ltd., Yongin-si (KR)

(72) Inventors: Ye-Bin Lee, Yongin-si (KR); Hyun-Jae Lee, Seoul (KR); Kang-Won Lee, Seoul (KR); Young-Sik Kim, Cheonan-si (KR); Won-Gu Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 292 days.

(21) Appl. No.: 15/464,259

(22) Filed: Mar. 20, 2017

(65) Prior Publication Data
US 2018/0063962 A1 Mar. 1, 2018

(30) Foreign Application Priority Data
Aug. 29, 2016 (KR) .................. 10-2016-0110138

(51) Int. Cl.
H05K 1/18 (2006.01)
H05K 1/11 (2006.01)
H05K 1/14 (2006.01)
G06F 3/041 (2006.01)
H05K 1/02 (2006.01)

(52) U.S. Cl.
CPC .............. H05K 1/189 (2013.01); G06F 3/041 (2013.01); H05K 1/0218 (2013.01); H05K 1/111 (2013.01);
(Continued)

(58) Field of Classification Search
CPC ...... G06F 3/041; G06F 3/0412; G06F 3/0416; G06F 3/044–047; G06F 2203/04103;
(Continued)

(56) References Cited

U.S. PATENT DOCUMENTS 5,592,365 A 1/1997 Sugimoto et al.
6,122,022 A * 9/2000 Hayakawa .......... G02F 1/13334
313/582
(Continued)

FOREIGN PATENT DOCUMENTS

KR 10-1999-0002250 1/1999
KR 10-2014-0131130 11/2014
(Continued)

OTHER PUBLICATIONS

Extended European Search Report dated Jan. 22, 2018, in European Patent Application No. 17183661.2.

Primary Examiner — Nathan Danielsen
(74) Attorney, Agent, or Firm — H.C. Park & Associates, PLC

(57) ABSTRACT

A display device includes a first substrate, a flexible printed circuit, and a film. The flexible printed circuit is disposed on a first area of the first substrate. The film is disposed on the first substrate and the flexible printed circuit. The flexible printed circuit includes a second substrate, a pad area, and a dummy pad. The pad area comprises pads disposed on the second substrate. The pads extend in a first direction and are spaced apart from one another in a second direction crossing the first direction. The dummy pad is disposed on the second substrate. The dummy pad is spaced apart from the pad area.

20 Claims, 14 Drawing Sheets

(52) U.S. Cl.
CPC ... *H05K 1/147* (2013.01); *G06F 2203/04103* (2013.01); *H05K 2201/09781* (2013.01)

(58) Field of Classification Search
CPC .... G09G 3/2092; G09G 3/2096; G09G 5/003; G09G 5/006; G09G 2300/0421; H05K 1/0272; H05K 1/111; H05K 1/118; H05K 1/147; H05K 1/189; H05K 3/281; H05K 3/361–365; H05K 3/465; H05K 2201/09736; H05K 2201/09781; H05K 2201/10128; H05K 2203/1178; G02F 1/13338
See application file for complete search history.

(56) References Cited

U.S. PATENT DOCUMENTS

| | | | |
|---|---|---|---|
| 9,436,223 B2 | 9/2016 | Youn | |
| 2004/0178250 A1* | 9/2004 | Cherian | B23K 1/0016 228/180.1 |
| 2005/0241758 A1* | 11/2005 | Kim | G02F 1/13452 156/308.2 |
| 2008/0285241 A1* | 11/2008 | Hou | H05K 1/0281 361/749 |
| 2010/0208188 A1* | 8/2010 | Tsai | G02F 1/133305 349/153 |
| 2011/0032687 A1* | 2/2011 | Song | H05K 3/361 361/803 |
| 2014/0176840 A1* | 6/2014 | Hashido | G02F 1/13306 349/33 |
| 2016/0147361 A1* | 5/2016 | Ahn | G06F 3/0416 345/173 |
| 2016/0212838 A1* | 7/2016 | Lee | H05K 1/028 |
| 2017/0357342 A1 | 12/2017 | Park et al. | |

FOREIGN PATENT DOCUMENTS

| | | |
|---|---|---|
| KR | 10-2015-0035241 | 4/2015 |
| WO | 2016/122116 | 8/2016 |

* cited by examiner

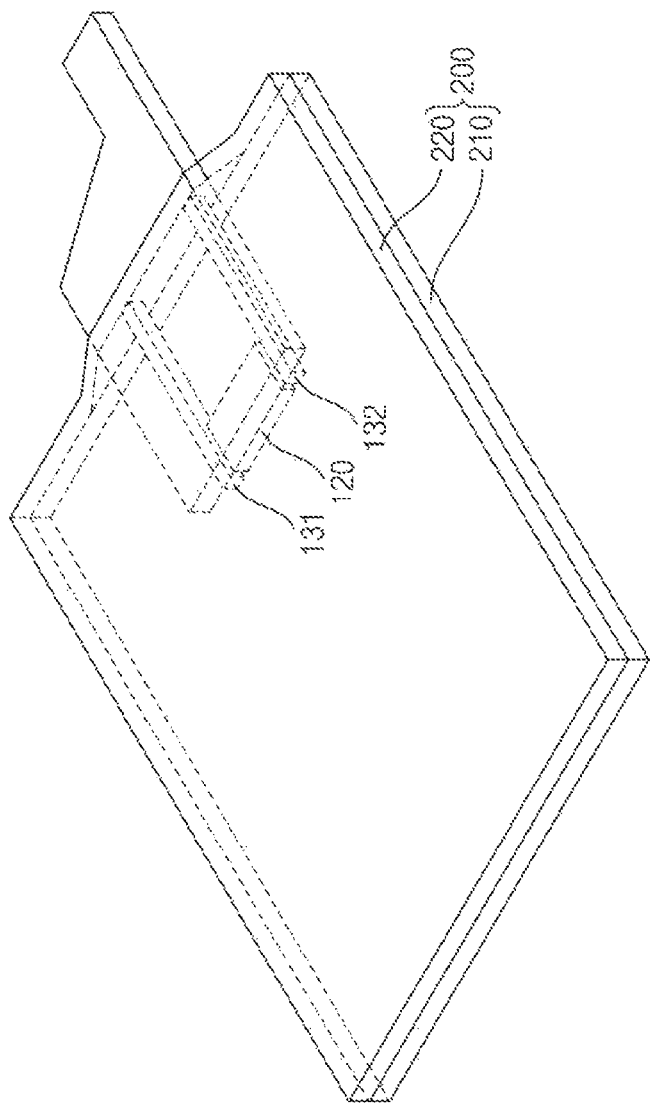

FIG. 5C
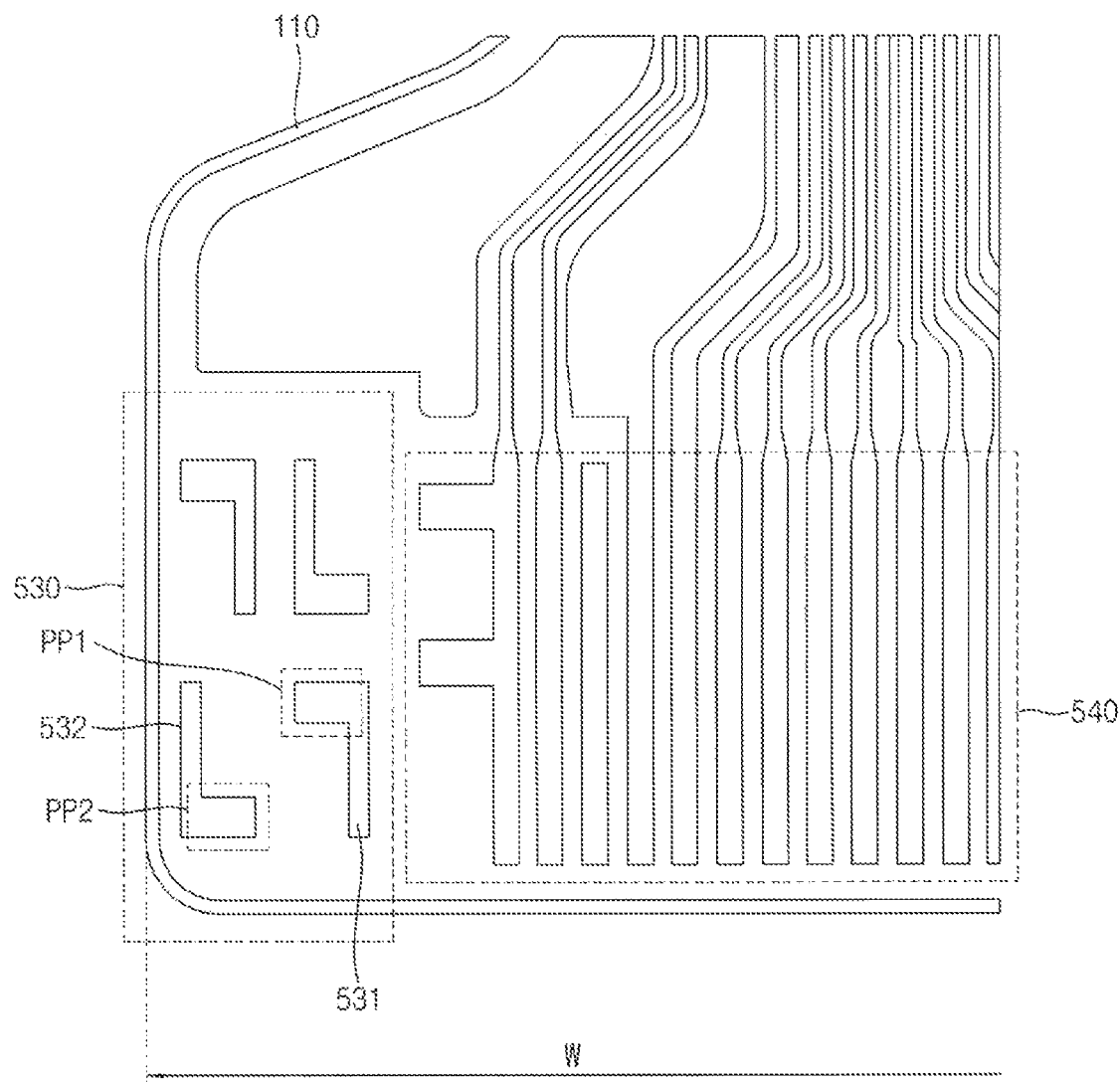
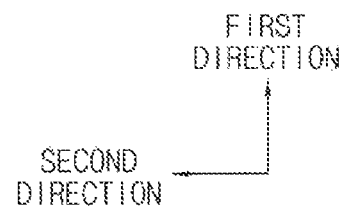

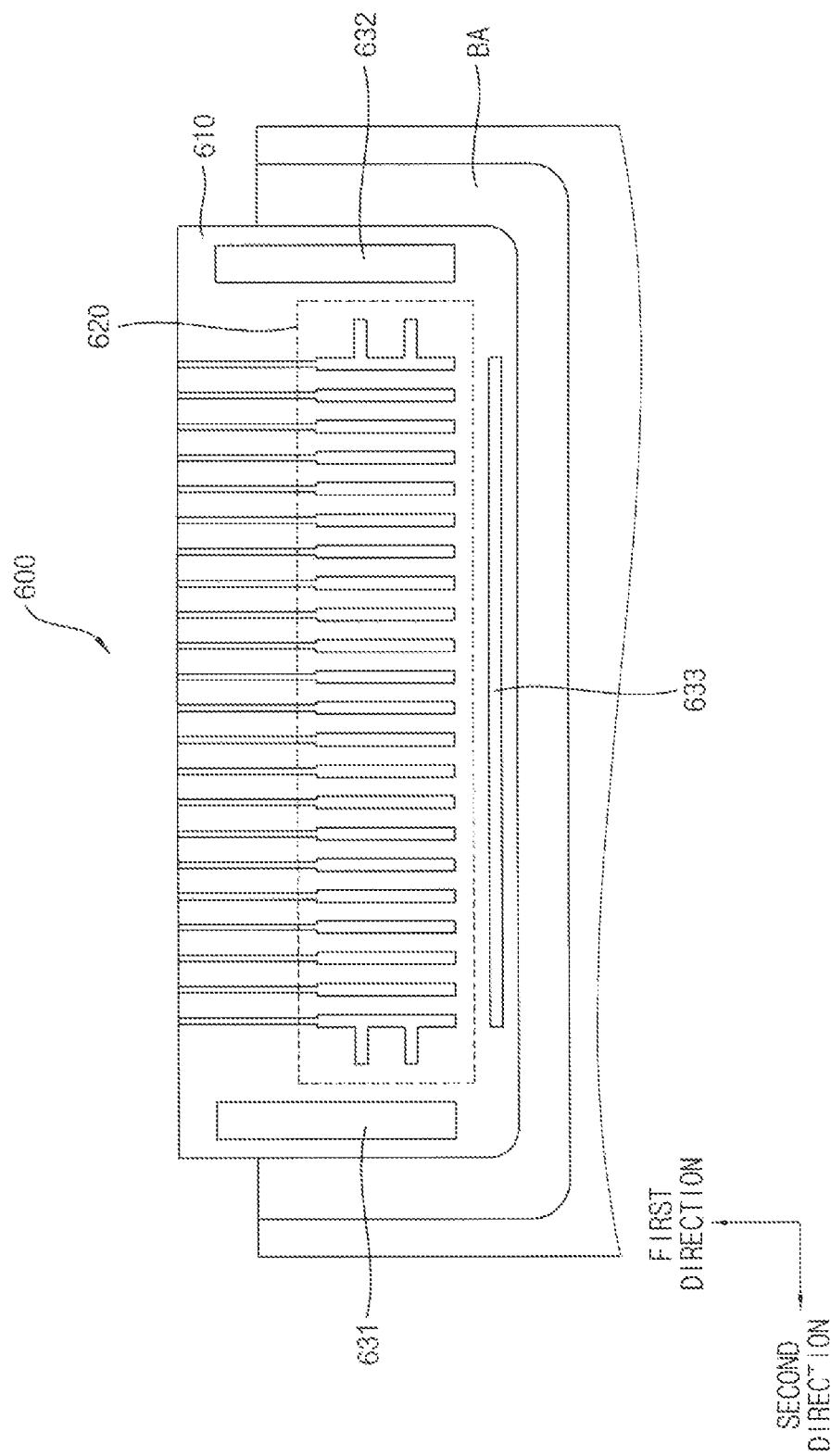

FLEXIBLE PRINTED CIRCUIT AND DISPLAY DEVICE

CROSS-REFERENCE TO RELATED APPLICATION

This application claims priority from and the benefit of Korean Patent Application No. 10-2016-0110138, filed on Aug. 29, 2016, which is hereby incorporated by reference for all purposes as if fully set forth herein.

BACKGROUND

Field

One or more exemplary embodiments relate to a display technology, and, more particularly, to a flexible printed circuit and a display device including a flexible printed circuit.

Discussion

A conventional display device may include a display panel to display an image based on input data, a touch panel (or touch sensing unit, touch sensing structure, etc.) to receive a touch (or hover) input, and an anti-reflection layer (e.g., a polarizing film), which may also be referred to as a "POL" layer. The touch panel includes a sensor (or a sensing panel) and a flexible printed circuit located or deposited on a portion of the sensor (e.g., on a dead space). It is noted that the polarizing film is located or deposited on the touch panel (and on the flexible printed circuit). The polarizing film may be configured to darken an image displayed via the conventional display device, manage reflection of ambient light, suppress glare, and/or function in other similar manners. During a process for depositing the polarizing film on the touch panel, air bubbles may occur (and/or remain and grow) due to a gap between the touch panel and the polarizing film (e.g., a gap caused, at least in part, by the flexible printed circuit). When the air bubbles are not discharged to an outside (e.g., an ambient environment), the air bubbles may propagate inside of the display panel (or grow in an area corresponding to a displaying area of the display panel). The presence of such air bubbles may cause defects and/or reduce display quality of a conventional display device.

The above information disclosed in this Background section is only for enhancement of understanding of the background of the inventive concepts, and, therefore, it may contain information that does not form the prior art that is already known to a person of ordinary skill in the art.

SUMMARY

One or more exemplary embodiments provide a flexible printed circuit configured to remove, expire, or at least reduce air bubbles that occur between a panel and a film during a manufacturing process of a display device.

One or more exemplary embodiments provide a display device configured to remove, expire, or at least reduce air bubbles that occur between a touch panel and a polarizing film during a manufacturing process of the display device.

Additional aspects will be set forth in the detailed description which follows, and, in part, will be apparent from the disclosure, or may be learned by practice of the inventive concepts.

According to one or more exemplary embodiments, a display device includes a first substrate (or touch sensing unit), a flexible printed circuit, and a film. The flexible printed circuit is disposed on a first area of the first substrate. The film is disposed on the first substrate and the flexible printed circuit. The flexible printed circuit includes a second substrate, a pad area, and a dummy pad. The pad area includes pads disposed on the second substrate. The pads extend in a first direction and are spaced apart from one another in a second direction crossing the first direction. The dummy pad is disposed on the second substrate. The dummy pad is spaced apart from the pad area.

According to one or more exemplary embodiments, a display device includes a touch sensing layer, a flexible printed circuit, and a film. The flexible printed circuit is coupled to a first area of the touch sensing layer. The film is coupled to the touch sensing layer and the flexible printed circuit. The touch sensing layer includes a substrate, a pad area, and a dummy pad. The pad area includes pads. The pads area disposed on the substrate and overlap the first area. The dummy pad is disposed on the substrate. The dummy pad is spaced apart from the pad area.

According to one or more exemplary embodiments, a flexible printed circuit includes a substrate, a pad area, and a dummy pad. The pad area includes pads disposed on the substrate. The pads extend in a first direction and are spaced apart from one another in a second direction crossing the first direction. The dummy pad is disposed on the substrate. The dummy pad is spaced apart from the pad area.

According to one or more exemplary embodiments, a flexible printed circuit may form or include an air path between a dummy pad and a pad unit to enable the flexible printed circuit to expel air bubbles to an ambient environment during a manufacturing process. The air bubbles may be generated as a result of a gap caused, at least in part, by the flexible printed circuit when a film is attached on (or under) the flexible printed circuit. Further, in one or more exemplary embodiments, a display device may include the flexible printed circuit including the air path to enable air bubbles formed during a manufacturing process to be expelled during the manufacturing process.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 2 is a perspective view of the display device of FIG. 1, according to one or more exemplary embodiments.

FIGS. 5A, 5B, and 5C are plan views of a flexible printed circuit of the display device of FIG. 1, according to one or more exemplary embodiments.

FIG. 6 is a plan view of a flexible printed circuit of the display device of FIG. 1, according to one or more exemplary embodiments.

DETAILED DESCRIPTION OF THE ILLUSTRATED EMBODIMENTS

Figure 1:
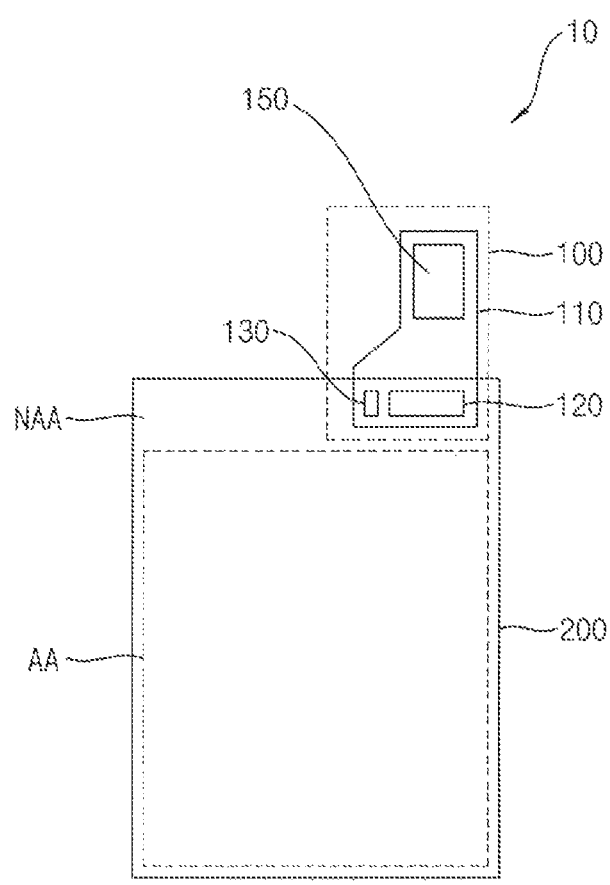
FIG. 1 is a diagram of a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

For instance, one or more exemplary embodiments may be described and/or illustrated in terms of functional blocks, units, and/or modules. One of ordinary skill in the art will appreciate that these blocks, units, and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or similar devices, the blocks, units, and/or modules may be programmed using software (e.g., microcode) to perform various features, functions, and/or processes, and may optionally be driven by firmware and/or software. Alternatively, each block, unit, and/or module may be implemented by dedicated hardware, or as a combination of dedicated hardware to perform some functions and a processor (e.g., one or more programmed microprocessors and associated circuitry) to perform other functions. Without departing from the scope of the inventive concepts, a block, unit, and/or module may be separated into two or more interacting and discrete blocks, units, and/or modules or may be combined into more complex blocks, units, and/or modules.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the first direction, the second direction, and another direction crossing the first direction and the second direction in another plane are not limited to three axes of a rectangular coordinate system, and may be interpreted in a broader sense. For example, respective axes corresponding to the first direction, the second direction, and the another direction may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a diagram of a display device, according to one or more exemplary embodiments. FIG. 2 is a perspective view of the display device of FIG. 1, according to one or more exemplary embodiments.

Referring to FIGS. 1 and 2, the display device 10 may include a flexible printed circuit (or flexible printed circuit board) 100 and a layer structure 200, which may be a structure of one or more layers, panels, films, etc.

The layer structure 200 may include a first substrate 210 (or, a first film, a first panel, a first layer, etc.) and a film 220 (or a second film, a second panel, a second layer, etc.). The film 220 may have a shape (and, thereby, a size, e.g., a surface area) that is the same as a shape (and, thereby, a size, e.g., a surface area) of the first substrate 210. For example, the first substrate 210 may be a touch sensing unit (or touch sensing structure) to sense a touch input, and the film 220 may be an anti-reflection film, such as a polarizing film. For example, the first substrate 210 may be a display panel to display an image using pixels, and the film 220 may be a polarizing film. For descriptive convenience, the display device 10 will be described with the assumption that the first substrate 210 is the touch sensing unit and the film 220 is a polarizing film configured to darken an image displayed via the display device 10, manage reflection of ambient light, suppress glare, and/or the like.

The flexible printed circuit 100 may be located or deposited on a first area of the first substrate 210. The first area may be a non-activate area NAA of the first substrate 210. For example, the first substrate 210 may include an activate area AA and the non-activate area NAA, the activate area AA including a structure (e.g., electrode) to sense a touch (or hover) input of a user, and the non-activate area NAA may be a remaining area of the first substrate 210 excluding the activate area AA (e.g., an edge or a dead space of the first substrate 210). For example, the activate area AA may correspond to a displaying area of a display panel (e.g., an area including pixels and exposed to an outside of the display panel), and the non-activate area NAA may correspond to a non-displaying area of the display panel (e.g., a dead space). It is contemplated, however, that the non-active area NAA may be a portion of the first substrate 210 that is disposed outside the active area of the first substrate 210.

The flexible printed circuit 100 may include a second substrate 110, a pad unit (or pad structure) 120, a dummy pad 130, and a controller (or processor, circuit, etc.) 150. The second substrate 110 may be a flexible substrate. Although not illustrated in FIGS. 1 and 2, the pad unit 120 may include pads (or bumps) to electrically connect the first substrate 210 and the flexible printed circuit 100 (or the controller). For example, the pads may be electrically connected to lines (or pads, bumps, etc.) arranged on the first substrate 210.

The controller 150 may supply power to the first substrate 210 through the pad unit 120, may receive a sensing signal (e.g., a signal corresponding to a change of conductance, capacitance, etc., due to a touch input) through the pad unit 120, and may calculate (or otherwise determine) a location of the touch input based on the sensing signal. For example, the controller may be implemented as an integrated circuit (IC), however, exemplary embodiments are not limited thereto or thereby. Although not illustrated in FIGS. 1 and 2, the flexible printed circuit 100 may further include lines arranged between the controller 150 and the pad unit 120. The lines may electrically connect the controller and the pad unit 120.

The dummy pad 130 may be spaced apart from the pad unit 120 and may be formed (or be deposited, coupled, etc.) on the second substrate 110. The dummy pad 130 may form an air path with the pad unit 120. As will become more apparent below, the air path may penetrate (or pass through) a first portion and a second portion of the first area. For example, the air path may be formed to penetrate a portion of the second substrate 110 adjacent to the activate area AA and another portion of the second substrate 110 adjacent to an outermost portion of the first substrate 210.

As seen in FIG. 2, the film 220 may be deposited on the first substrate 210 and a portion of the flexible printed circuit 100 (e.g., a portion corresponding to the non-active area of the first substrate 210 and including the pad unit 120 and the dummy pad 130). During a process of depositing the film 220 on the first substrate 210 and the portion of the flexible printed circuit 100, air bubbles may occur between the first substrate 210 and the film 220 (e.g., around the flexible printed circuit 100) due to a gap between the first substrate 210 and the film 220 caused, at least in part, by the flexible printed circuit 100. If the air bubbles are not discharged (or not expired, not exhausted, not output, not removed) to an outside (e.g., ambient environment), the air bubbles may go (or grow) inside of the display device 10 (or in a direction from an edge to a center of the first substrate 210) such that the display device 10 may be defective or experience reduced display quality. Therefore, the display device 10 according to one or more exemplary embodiments may prevent (or at least reduce) defects of the display device 10 by including the dummy pad 130 (or the air path formed by the dummy pad 130) and by expiring the air bubbles to an outside, such as an ambient environment.

According to one or more exemplary embodiments, the dummy pad 130 may include a first dummy pad 131 (or a first sub-dummy pad) and a second dummy pad (or a second sub-dummy pad) 132. The first dummy pad 131 may be located apart from a left side of the pad unit 120 and may form a first air path (e.g., an air path to discharge the air bubbles from an inside region to an outside of the display device 10) with the pad unit 120. The first air path may extend from an inner region of the non-activate area NAA (e.g., a boundary region between the non-activate area NAA and the activate area AA) to an outer region of the non-activate area NAA (e.g., a region of the non-activate area NAA exposed to the outside). Similarly, the second dummy pad 132 may be located apart from a right side of the pad unit 120 and may form a second air path with the pad unit 120. The second air path may extend from the inner region of the non-activate area NAA to the outer region of the non-activate area NAA. In this manner, the flexible printed circuit 100 may discharge air bubbles that may otherwise be trapped between the first substrate 210 and the film 220, through the first and second air paths to the outside.

In one or more exemplary embodiments, the dummy pad 130 may be formed in a process of forming the pad unit 120 or may be formed in another process different from the process of forming the pad unit 120. For example, the dummy pad 130 may be formed in a process of forming the outermost layer of the flexible printed circuit 100.

As described above, the display device 10 may include the first substrate 210, the flexible printed circuit 100 deposited on the first area of the first substrate 210, and the film 220 deposited on the first substrate 210 and the flexible printed circuit 100 and may form the air path (or the air paths) between the dummy pad 130 and the pad unit 120. In this manner, the display device 10 may discharge air bubbles occurring between the first substrate 210 and the film 220 when the film 220 is deposited on the first substrate 210 and the flexible printed circuit 100. The air bubbles may be discharged to the outside (e.g., an ambient environment) through the air path and may prevent (or at least reduce) defects of the display device 10 due to the air bubbles.

Although the example embodiments of FIGS. 1 and 2 describe that the controller 150 is implemented as an integrated circuit (IC) chip, and the controller 150 is included in or mounted on the flexible printed circuit 100 (i.e., chip-on-film (COF)), the controller 150 may be placed in various position. In one example embodiment, the controller 150 implemented as the IC chip (i.e., the driving unit) may be mounted on the non-active area NAA of the first substrate 210 (i.e., chip-on-glass (COG) or chip-on-panel (COP)). In this case, the first substrate 210 may be flexible transparent resin substrate. For example, the transparent resin substrate may be a polyimide substrate including a first polyimide layer, a first barrier layer, a second polyimide layer, a second barrier layer, etc. The film 220 may be a protection layer disposed on the first substrate 210 and at least one of the driving unit and the flexible electronic circuit 100. Also, the dummy pad may be disposed adjacent to the pad area including pads and disposed on the first substrate 210 or the flexible electronic circuit 100 such that the air bubbles generated between the first substrate 210 and the film 220 can be easily discharged.

Figure 3A:
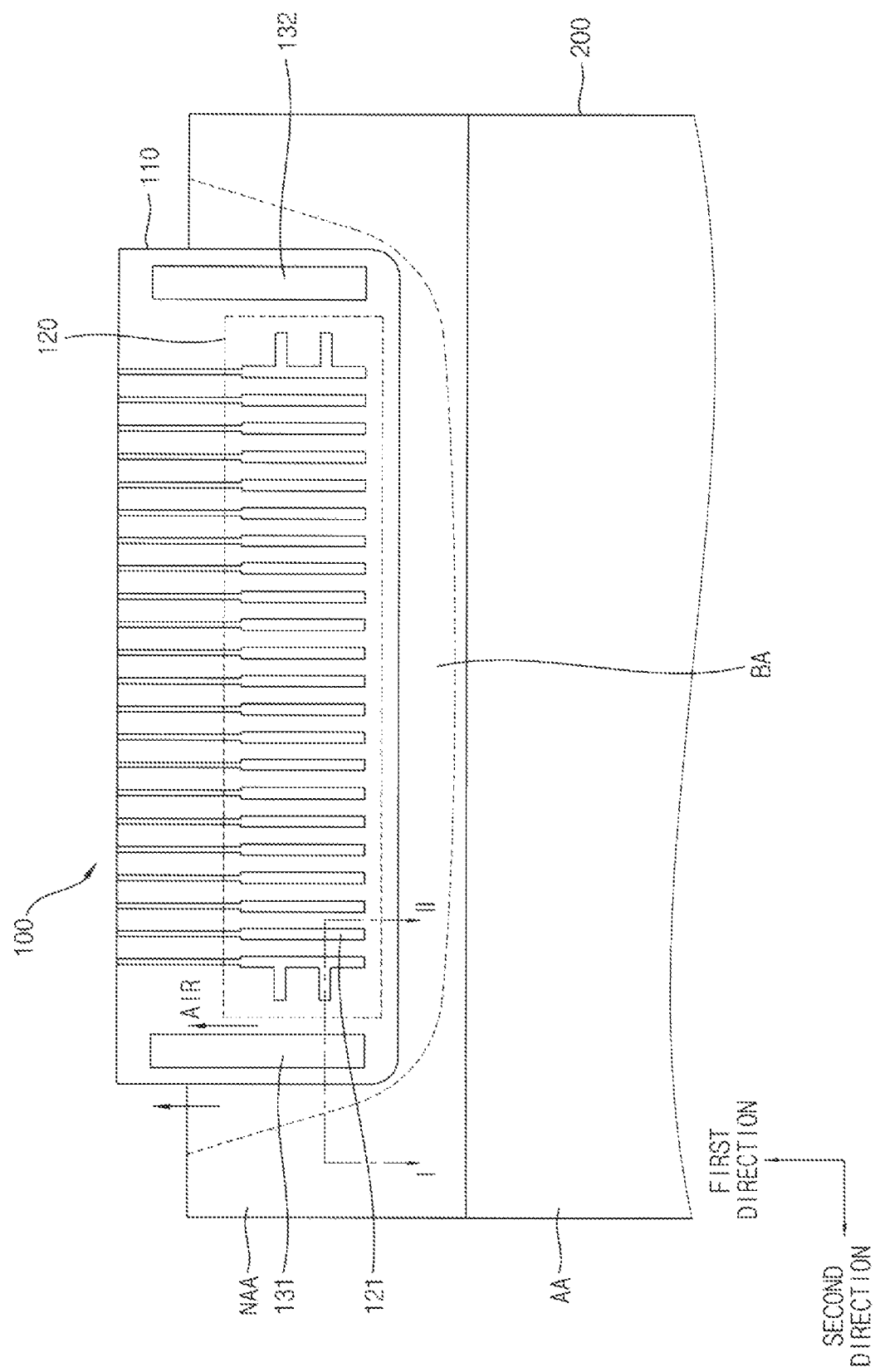
FIG. 3A is a plan view of a flexible printed circuit of the display device of FIG. 1, according to one or more exemplary embodiments.
Figure 3B:
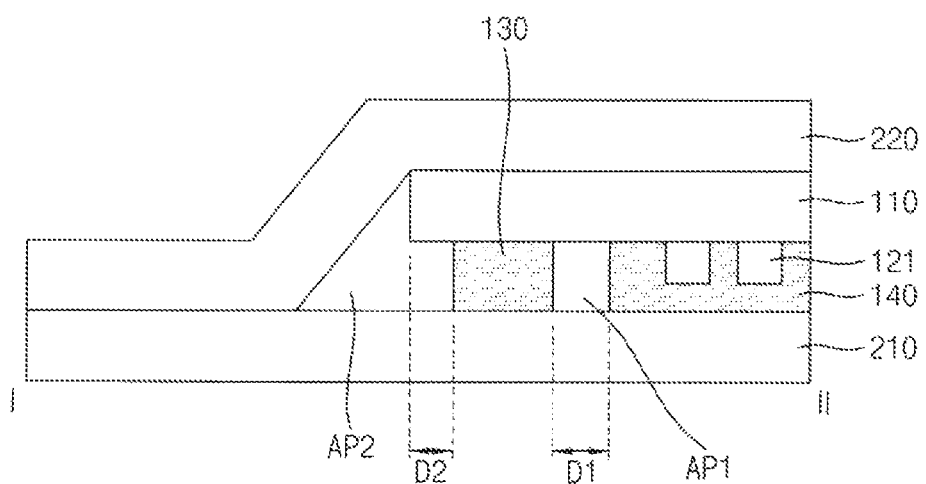
FIG. 3B is a cross-sectional view of the flexible printed circuit of FIG. 3A taken along sectional line I-II, according to one or more exemplary embodiments.
Figure 3C:
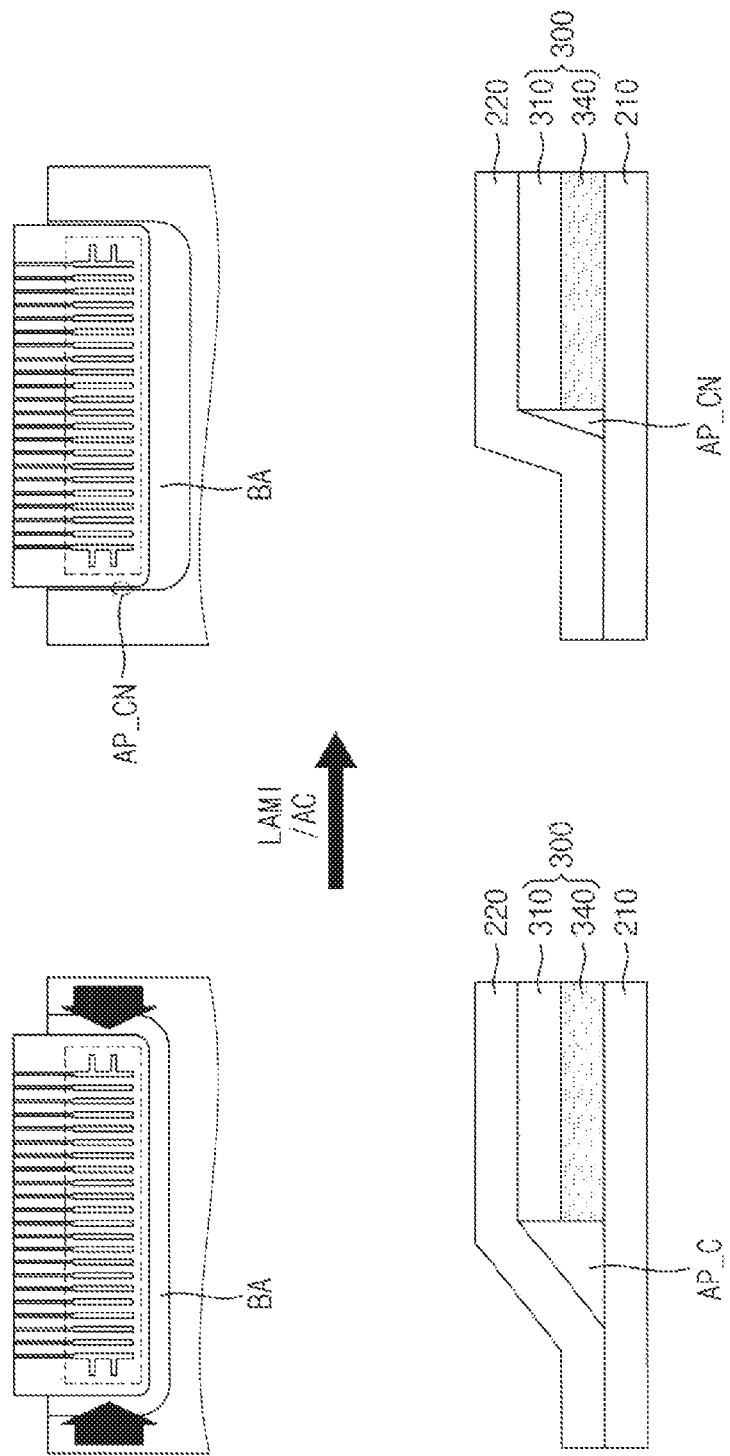
FIG. 3C provides plan views and cross-sectional views of a comparative flexible printed circuit, according to one or more exemplary embodiments.

FIG. 3A is a plan view of a flexible printed circuit of the display device of FIG. 1, according to one or more exemplary embodiments. FIG. 3B is a cross-sectional view of the flexible printed circuit of FIG. 3A taken along sectional line I-II, according to one or more exemplary embodiments. FIG. 3C provides plan and cross-sectional views of a comparative flexible printed circuit, according to one or more exemplary embodiments.

Referring to FIGS. 3A and 3B, the flexible printed circuit 100 may include the second substrate 110, the pad unit 120, the first dummy pad 131, and the second dummy pad 132. The second substrate 110, the pad unit 120, the first dummy pad 131, and the second dummy pad 132 may be the same as the second substrate 110, the pad unit 120, and the dummy pad 130 (or the first and second dummy pads 131 and 132) described with reference to FIGS. 1 and 2. Duplicative descriptions are omitted to avoid obscuring exemplary embodiments.

The pad unit 120 may include pads 121, and the pads 121 may extend in a first direction on the second substrate 110 and may be arranged (e.g., spaced apart from one another) along a second direction perpendicular to the first direction. The first dummy pad 131 may extend in the first direction and may be located apart from a first pad of the pads 121 located at an outermost position in the second direction. Similarly, the second dummy pad 132 may extend in the first direction and may be located apart from a second pad of the pads 121 located at an outermost position in a direction opposite the second direction. It is noted that a shape of the aforementioned first and second pads of the pads 121 may be different than the shape of pads 121 disposed between the aforementioned first and second pads of the pads 121. Exemplary embodiments, however, are not limited thereto or thereby.

The flexible printed circuit 100 may be deposited on the non-activate area NAA of the first substrate 210 (or on a bonding area of the first substrate 210), and film 220 may be deposited on the first substrate 210. As illustrated in FIG. 3B, the flexible printed circuit 100 may be deposited on (or coupled to) the first substrate 210 through an adhesive layer 140. The adhesive layer 140 may be on only the pad unit 120 and may not be on the dummy pad 130. For example, the adhesive layer 140 may be anisotropic conductive film, such as an epoxy resin film, and may bond the first substrate 210 and the flexible printed circuit 100.

When the film 220 is deposited on the first substrate 210, an air bubble area BA including air bubbles may occur around the flexible printed circuit 100. The air bubbles may occur through a module process of the display device 10 (e.g., a lamination process and an autoclave process), but may be discharged through one or more air paths. For example, the air bubbles may occur during a lamination process of the display device 10 and may be discharged through one or more air paths during an autoclave process.

As illustrated in FIG. 3B, a first air path AP1 may be formed between the dummy pad 130 (or the first dummy pad 131) and the pad unit 120 (or the adhesive layer 140), and a second air path AP2 may be formed along a boundary of the flexible printed circuit 100 between the dummy pad 130 (or the first dummy pad 131) and the film 220. The air bubbles may be discharged to the outside, e.g., to an ambient environment, through the first air path AP1 and/or the second air path AP2.

Referring to FIG. 3C, a comparative flexible printed circuit 300 may not include a dummy pad and may be attached to the first substrate 210 through a comparative adhesive layer 340 formed on a comparative substrate 310. When the film 220 is deposited on the first substrate 210 (e.g., during a lamination process), the air bubble area BA may occur. A comparative air path AP_C may be formed between the first substrate 210 and the film 220. The comparative air path AP_C (or a width of the comparative air path AP_C) may be narrowed through the lamination process and an autoclave process to form modified comparative air path AP_CN. In this manner, air bubbles may not be discharged smoothly (or completely) and may go into the active area AA of the first substrate 210 through the autoclave process. That is, the air bubbles may be in a displaying area (or in the active area AA corresponding to the displaying area) displaying an image and may be visible or seen by an observer. Therefore, a quality of the image displayed on the displaying area may be deteriorated. As display devices trend toward low-bezel areas of the display device 10, a non-displaying area of the display device 10 (or the non-activate area NAA corresponding to the non-displaying area of the display device) is also narrowed and defects due to air bubbles may occur more frequently.

According to one or more exemplary embodiments, the flexible printed circuit 100 may include (or form) an air path using the dummy pad 130 and may output generated air bubbles through the air path. In this manner, the flexible printed circuit 100 may prevent defects due to the air bubbles.

Adverting back to FIG. 3B, the dummy pad 130 (or the first dummy pad 131) may be spaced apart from the pad unit 120 (or from the adhesive layer 140) by a first distance D1 (or a first gap), and may be spaced apart from a boundary of the second substrate 110 by a second distance D2. For example, the first distance D1 may be greater than or equal to 0.20 millimeter (mm) (e.g., 0.25 mm), and the second distance D2 may be greater than or equal to 0.10 mm. As such, the air bubbles may be discharged more easily.

In one or more exemplary embodiments, the dummy pad 130 may extend (e.g., longitudinally extend) in the first direction to protrude outward from the non-activate area NAA of the first substrate 210. The air bubble area BA may be directly connected to the outside through the air path such that the air bubbles may be discharged more easily.

Although the first dummy pad 131 and the second dummy pad 132 are illustrated in FIG. 3A with rectangular shapes (or rectangular planar shapes), it is contemplated that the first dummy pad 131 and/or the second dummy pad 132 may have any suitable shape. For instance, various shapes for the first dummy pad 131 and the second dummy pad 132 will be described with reference to FIGS. 5A, 5B, and 5C.

Figure 4A:
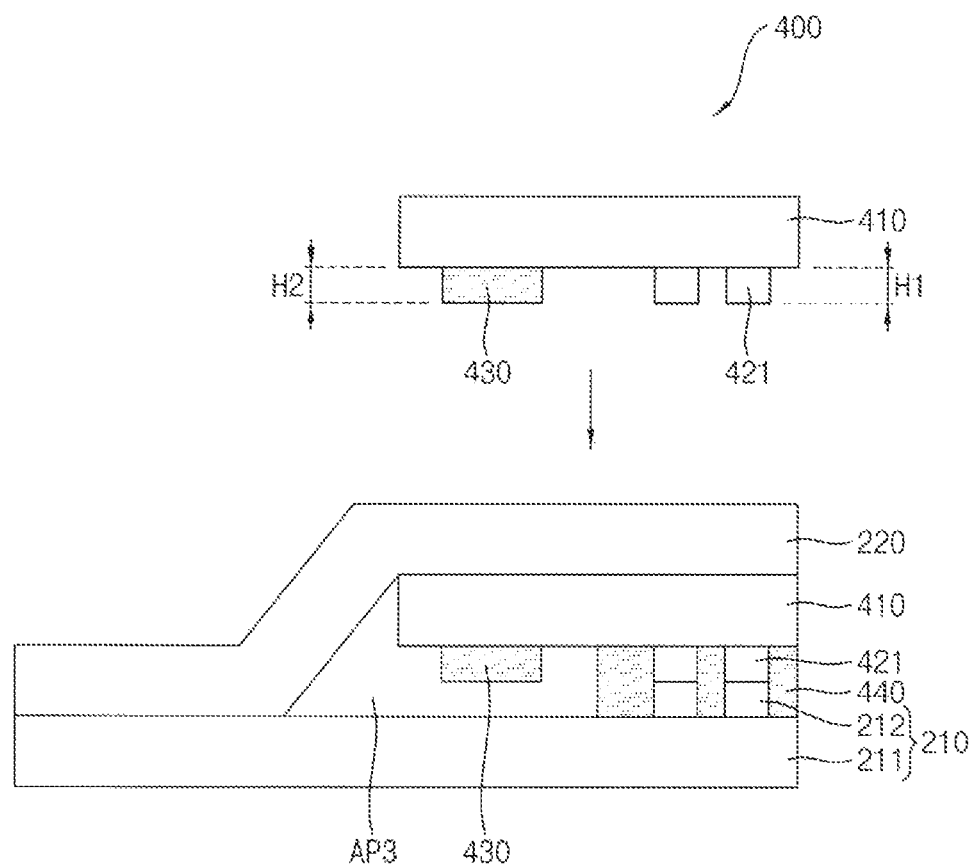
FIGS. 4A, 4B, and 4C are cross-sectional views of a flexible printed circuit of the display device of FIG. 1, according to one or more exemplary embodiments.
Figure 4B:
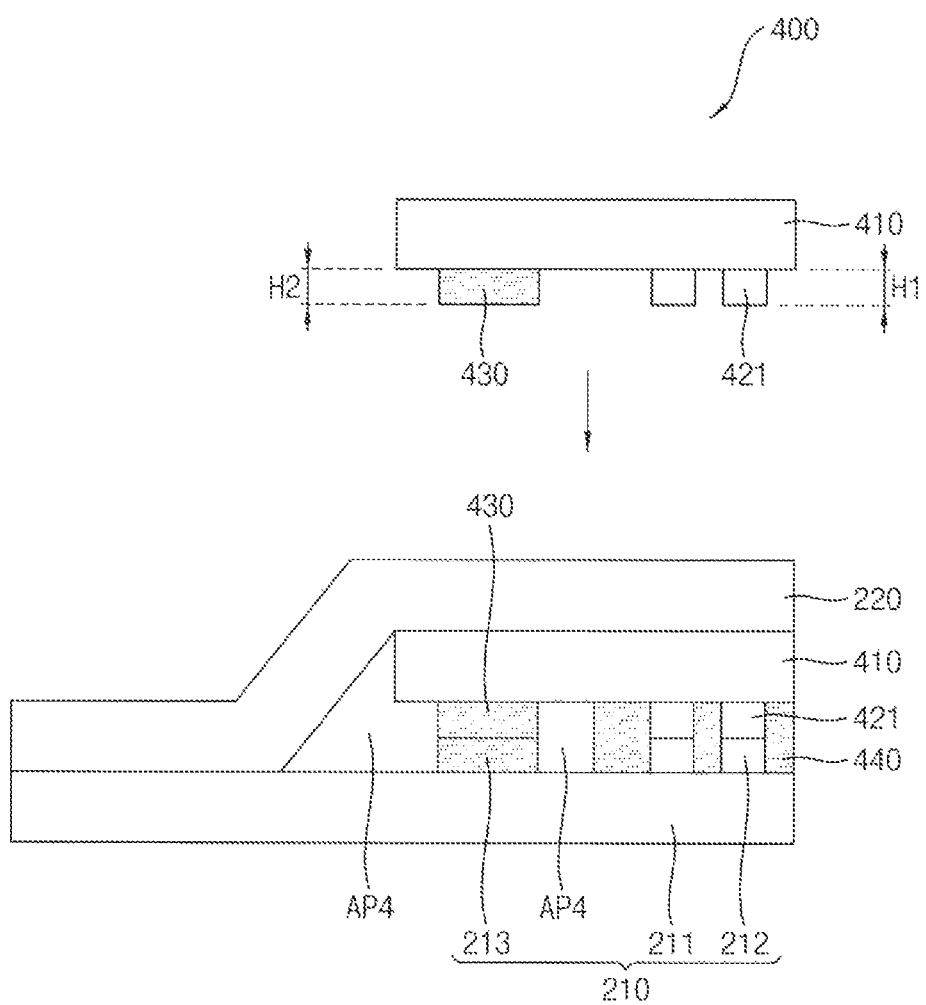
Figure 4C:
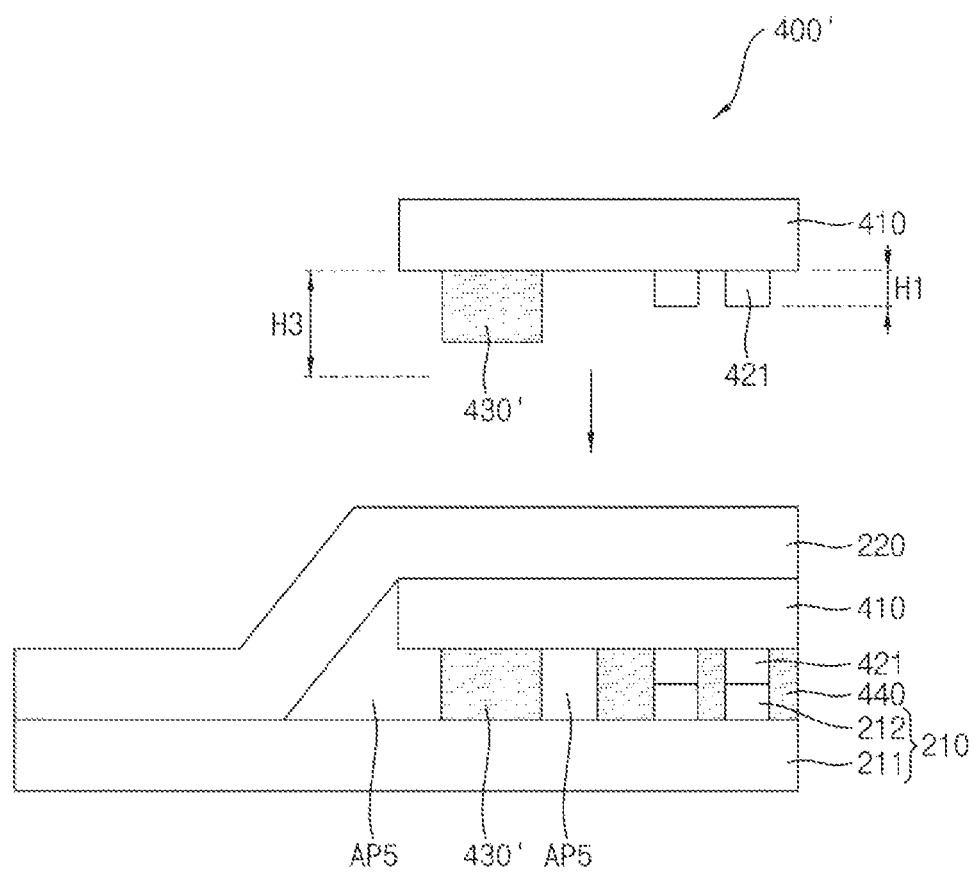

FIGS. 4A, 4B, and 4C are cross-sectional views of a flexible printed circuit of the display device of FIG. 1, according to one or more exemplary embodiments.

Referring to FIG. 4A, the flexible printed circuit 400 may include a second substrate 410, pads 421, and a dummy pad 430. The second substrate 410, the pads 421, and the dummy pad 430 may be the same as or substantially the same as the second substrate 110, the pads 121, and the dummy pad 130 described with reference to FIGS. 1, 2, 3A, and 3B. As such, duplicative descriptions are omitted to avoid obscuring exemplary embodiments.

As illustrated in FIG. 4A, the dummy pad 430 may be formed to have a second height H2 (or a second thickness) which is equal to (or substantially equal to) a first height (or a first thickness) of the pads 421 (or a pad unit 420). The first substrate 210 may include bumps 212 formed on the first area (or the non-activate area NAA), and the pads 421 of the flexible printed circuit 400 may be bonded with the bumps 212 through the adhesive layer 440. It is noted that the bumps 212 may be formed on (or be a part of) main body portion 211 of first substrate 210. A gap due to the flexible printed circuit 400 (or a thickness of the flexible printed circuit) may be greater than the second height H2, and a third air path AP3 may be formed. The third air path AP3 may include the first air path AP1 and the second air path AP2 described with reference to FIG. 3B and a space (or an additional air path) formed between the dummy pad 430 and the first substrate 210. In this manner, the space (or additional air path) may connect the first air path AP1 and the second air path AP2.

According to one or more exemplary embodiments, even though the second substrate 410 may be pressed in a direction toward the first substrate 210 through a module process (e.g., an autoclave process), the dummy pad 430 may support the second substrate 410, e.g., support the second substrate 410 from being unnecessarily deformed. In this manner, the third air path AP3 between the pad unit 420 (or the adhesive layer 440) and the dummy pad 430 may be maintained, and generated air bubbles may be discharged to the outside.

In one or more exemplary embodiments, the first substrate 210 may further include a support pad 213 (or a dummy bump) corresponding to the dummy pad 430 of the flexible printed circuit 400', as seen in FIG. 4B. The flexible printed circuit 400' illustrated in FIG. 4B may be the same as or substantially similar to the flexible printed circuit 400 illustrated in FIG. 4A. In this manner, the dummy pad 430 may have the second height H2 which is equal to (or substantially equal to) the first height H1 of the pads 421. The first substrate 210 may include the support pad 213 formed at a position corresponding to the dummy pad 430. For example, the support pad 213 may have a height that is the same as (or similar to) a height of the bumps 212 of the first substrate 210. In this manner, fourth air paths AP4 including the first air path AP1 and the second air path AP2 described with reference to FIG. 3B may be formed given that the support pad 213 supports the second substrate 410 with the dummy pad 430. As such, generated air bubbles may be discharged to the outside.

According to one or more exemplary embodiments, the dummy pad 430' may have a third height H3 greater than the first height H1 of the pads 421, as seen in FIG. 4C. With reference to FIG. 4C, the dummy pad 430' may be formed having the third height H3 greater than the first height H1 of the pads 421 (or the pad unit 420). When the film 220 is attached on the first substrate 210, fifth air paths AP5 may be formed. The fifth air paths AP5 may be substantially the same as the fourth air paths AP4 described with reference to FIG. 4B. For example, the third height H3 may be equal to a total height of boning of the pads 421 and the bumps 212. Given that the dummy pad 430' supports the second substrate 410, the fifth air paths AP5 that are substantially the same as the fourth air paths AP4 may be formed and generated air bubbles may be discharged to the outside.

As described with reference to FIGS. 4A, 4B, and 4C, a flexible printed circuit (e.g., flexible printed circuit 400 or 400'), according to one or more exemplary embodiments, may include a dummy pad (e.g., dummy pad 430 or 430') having a height (e.g., the second height H2 or the third height H3) greater than or equal to the first height H1 of the pads 421. The dummy pad 430 (or 430') may support the second substrate 410 such that one or more air paths may be maintained even through a module process is performed, and generated air bubbles may be discharged to the outside through the one or more air paths.

Figure 5A:
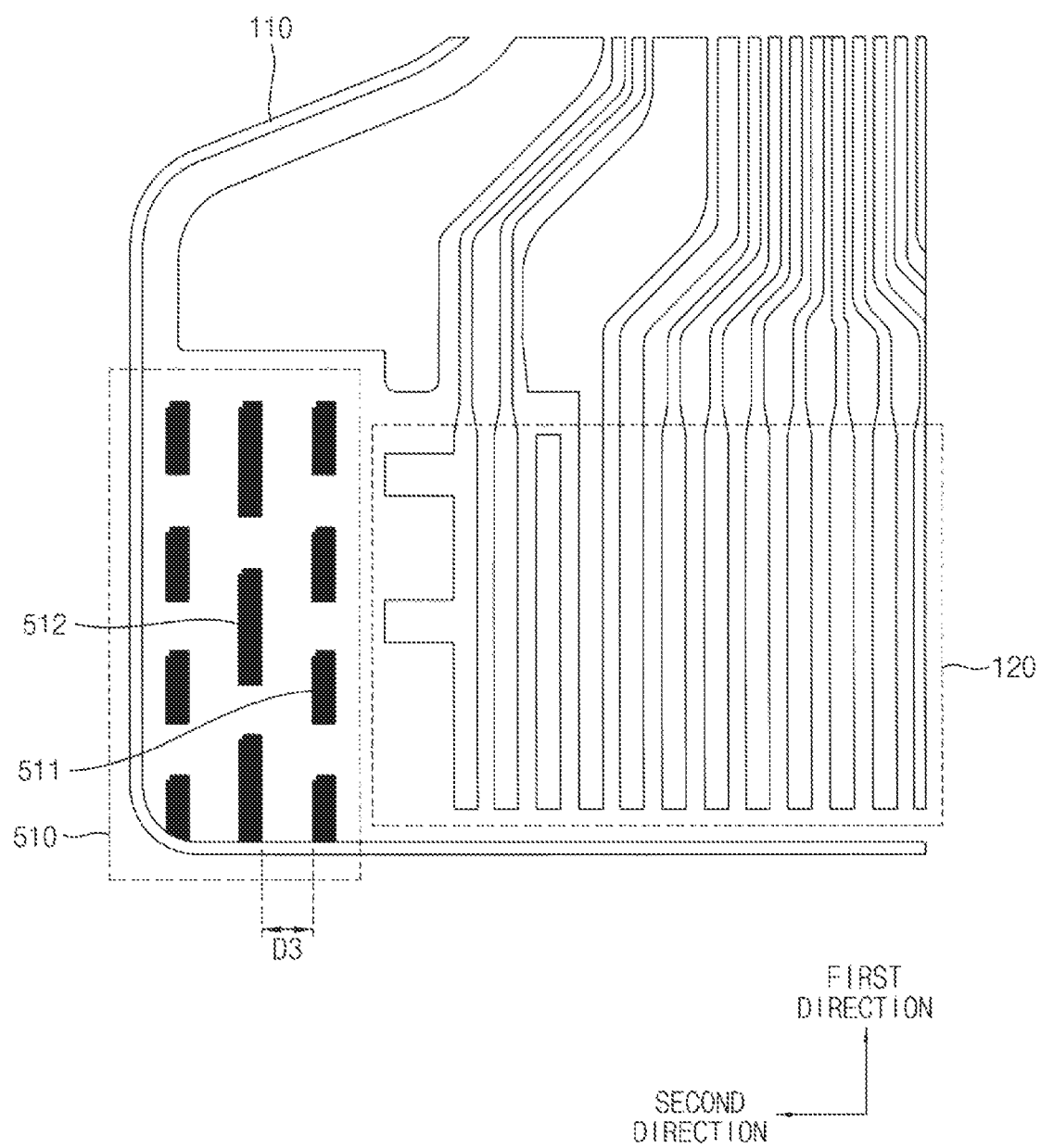
Figure 5B:
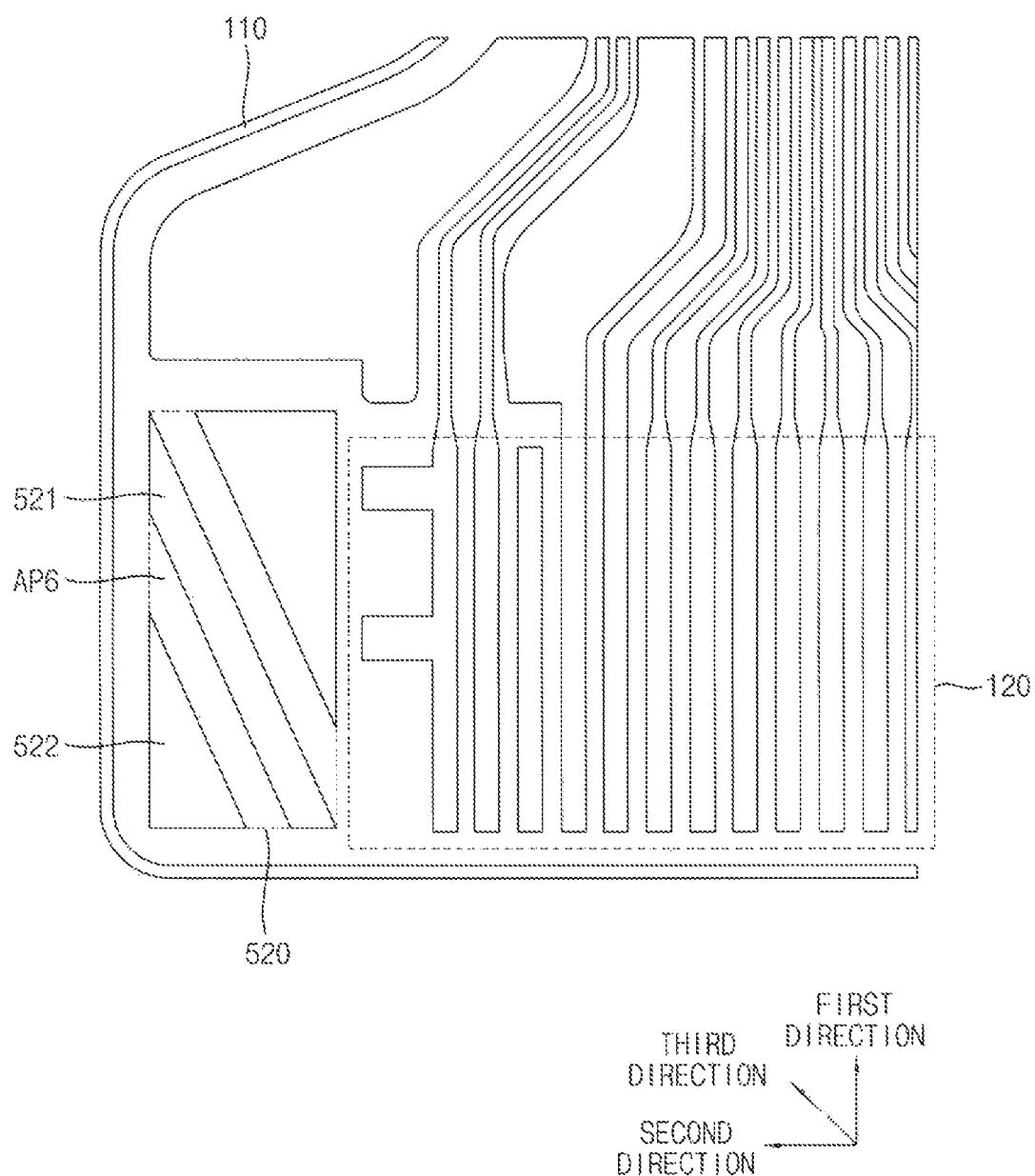

FIGS. 5A, 5B, and 5C are plan views of a flexible printed circuit of the display device of FIG. 1, according to one or more exemplary embodiments.

Referring to FIGS. 5A, 5B, and 5C, the flexible printed circuit 100 may include the second substrate 110, the pad unit 120, and a dummy pad (e.g., dummy pad 510, 520, and/or 530). The second substrate 110 and the pad unit 120 may be the same as the second substrate 110 and the pad unit 120 described with reference to FIGS. 1, 2, 3A, and 3B. Duplicative descriptions are, therefore, omitted to avoid obscuring exemplary embodiments.

Referring to FIG. 5A, the dummy pad 510 may include first dummy patterns 511. The first dummy patterns 511 may extend in the first direction and may be arranged along (e.g., spaced part from one another in) the first direction repeatedly. An air path may be formed in the first direction and in the second direction.

According to one or more exemplary embodiments, the dummy pad 510 may further include second dummy patterns 512. The second dummy patterns 512 may extend in the first direction and may be arranged along the first direction repeatedly. For example, the second dummy patterns 512 may be spaced apart from each other by a gap (or a distance, a pitch, etc.) that is greater than or equal to 0.20 mm in the first direction. In addition, the second dummy patterns 512 may be spaced apart from the first dummy patterns 511 by a third gap D3 (or a third distance, a third pitch, etc.) in the second direction, and a second length (in the first direction) of the second dummy patterns 512 may be different from a first length of the first dummy patterns 511. For example, the third gap D3 may be greater than or equal to 0.20 mm (e.g., 0.25 mm), and the second length of the second dummy patterns 512 may be longer than the first length of the first dummy patterns 511.

The dummy pad 510 may further include third dummy patterns apart from the second dummy patterns in the second direction. The third dummy patterns may be configured substantially the same as the first dummy patterns 511. Air paths may be formed in the first direction between the first, second, and third dummy patterns 511 and 512 such that generated air bubbles may be output (or discharged) more easily. In addition, the second length of the second dummy patterns 512 may be longer than the first length of the first dummy patterns 511 such that the generated air bubbles may be discharged along the first direction and may be prevented (or at least reduced) from being moved toward the pad unit 120 (or inside the flexible printed circuit 100). In this manner, generated air bubbles may be discharged relatively smoothly and easily.

Referring to FIG. 5B, the dummy pad 520 may include a sixth air path AP6 formed in a third direction, which may form an acute angle with respect to the first direction (and/or the second direction). The sixth air path AP6 may have a width of 0.25 mm. For example, the dummy pad 520 may include fourth dummy patterns 522, which have an equilateral triangle shape and of which oblique sides (or hypotenuses, longest sides) face each other.

The sixth air path AP6 may have a shortest distance between the air bubble area BA and the outside (e.g., a boundary of the first substrate 210 described with reference to FIG. 1). Again, the sixth air path AP6 may have a width of 0.25 mm, however, exemplary embodiments are not limited thereto or thereby. An air path formed between the first substrate 210, the film 220, and the flexible printed circuit 100 at points where two other ides of the fourth dummy patterns 522 meet (e.g., at vertex portions of the fourth dummy patterns 522 having a right angle) may be narrowed through a module process (e.g., a lamination process and/or an autoclave process). It is noted, however, that the dummy pad 520 may include the sixth air path AP6 passing between the points (e.g., at vertex portions of the fourth dummy patterns 522 having a right angle) with the shortest distance such that the air bubbles may be discharged smoothly.

According to one or more exemplary embodiments, the dummy pad 520 may have a fifth dummy pattern 521, which has a rectangle shape and formed between the fourth dummy patterns 522. The sixth air path AP6 may be narrowed as the second substrate 110 is pressed through an autoclave process, but the dummy pad 520 may maintain the sixth air path AP6 using the fifth dummy pattern 521.

The fourth dummy patterns 522 and the fifth dummy pattern 521 are illustrated as having an equilateral triangle shape and/or a square (or quadrangular) shape in FIG. 5B. It is noted, however, that the fourth dummy patterns 522 and the fifth dummy pattern 521 are not limited thereto or thereby. For example, the fourth dummy patterns 522 and the fifth dummy pattern 521 may have a circular shape, an elliptical shape, or partial patterns repeatedly arranged in the third direction similar to the first dummy patterns 511 described with reference to FIG. 5A.

Referring to FIG. 5C, the dummy pad 530 may include a sixth dummy patterns 531 extending in the first direction and having a first protruded part PP1 extending in the second direction at a first portion of the sixth dummy patterns 531. Similarly, the dummy pad 530 may include seventh dummy patterns 532 extending in the first direction and having second protruded parts PP2 extending in a direction opposite the second direction at second portions of the seventh dummy patterns 532. For example, the seventh dummy pattern 532 may be the same pattern as a pattern of the sixth dummy pattern 531, but may be rotated 180 degrees on the second substrate 110. An air path may be form in the third direction as a whole similar to the sixth air path AP6 described with reference to FIG. 5B. In one or more exemplary embodiments, the first protruded part PP1 (and the second protruded part PP2) may be an alignment pattern of the flexible printed circuit 100.

Referring to FIGS. 3A, 5A, 5B, and 5C, a pad located at the outermost region of the pad unit 120 may include an alignment pattern that is protruded in the second direction (or in a direction opposite the second direction). The alignment pattern may be used whether or not the flexible printed circuit 100 is aligned with respect to the first substrate 210 when the flexible printed circuit 100 is attached to the first substrate 210. In other words, the alignment pattern may be utilized to align features of a flexible printed circuit during one or more manufacturing processes. As seen in FIG. 5C, the pad unit 540 may include the alignment pattern compared with the pad unit 120 illustrated in FIG. 3A such that a width of the pad unit 540 may be narrower than a width of the pad unit 120 illustrated in FIG. 3A. That is, the flexible printed circuit 100 may form (or include) an air path with minimal increase in area (or, in a width W) of a portion contacting the first substrate 210.

As described with reference to FIGS. 5A, 5B, and 5C, the dummy pads 510, 520, and 530 of the flexible printed circuits may include dumpy patterns having various shapes and may form various air paths (e.g., the sixth air path AP6) having a shortest distance. In this manner, generated air bubbles may be discharged more easily.

FIG. 6 is a plan view of a flexible printed circuit of the display device of FIG. 1, according to one or more exemplary embodiments.

Referring to FIG. 6, the flexible printed circuit 600 may include a second substrate 610, a pad unit 620, and first, second, and third dummy pads 631, 632, and 633. The second substrate 610, the pad unit 620, and the first and second dummy pads 631 and 632 may be the same as or substantially the same as the second substrate 110, a pad unit 120, and the first and second dummy pads 131 and 132. As such, duplicative descriptions are omitted to avoid obscuring exemplary embodiments. It is noted, however, that the flexible printed circuit 600 may further include the third dummy pad 633 compared with the flexible printed circuit 100 illustrated in FIG. 3A.

According to one or more exemplary embodiments, the third dummy pad 633 (or a dummy line) may extend in the second direction and may be spaced apart from the pad unit 620 in a direction opposite the first direction. A length of the third dummy pad 633 in the second direction may be similar to or substantially equal to a length of the pad unit 620 in the second direction. The third dummy pad 633 may prevent (or at least reduce) generated air bubbles that occur between the first substrate 210 and the film 220 during a module process (e.g., an autoclave process) of the display device 10 from being moved in a direction opposite the first direction and may guide the air bubbles to an air path formed by the first and second dummy pads 631 and 632. That is, the third dummy pad 633 may prevent (or at least reduce) the air bubble area BA from enlarging toward the active area AA of the first substrate 210.

As described above, the flexible printed circuit 600, according to one or more exemplary embodiments, may prevent (or at least reduce) the air bubble area BA from being enlarged and may guide generated air bubbles to the air path by including (or by using) the third dummy pad (or the dummy line) 633. In this manner, generated air bubbles may be discharged smoothly and relatively easily.

Figure 7:
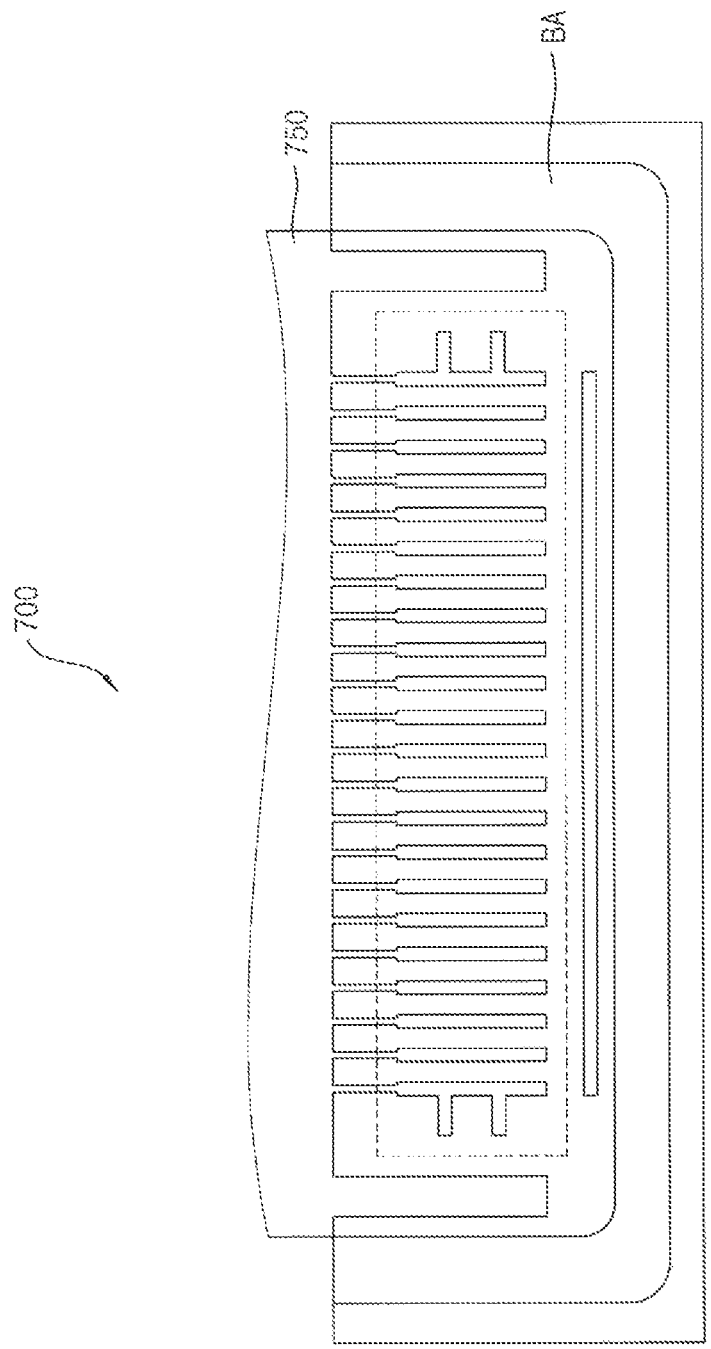
FIG. 7 is a plan view of a flexible printed circuit of the display device of FIG. 1, according to one or more exemplary embodiments.

FIG. 7 is a plan view of a flexible printed circuit of the display device of FIG. 1, according to one or more exemplary embodiments.

Referring to FIGS. 1 and 7, the flexible printed circuit 700 may include an electromagnetic shielding layer 750 (e.g., EMI tape) and/or a cover layer either of which is attached on the second substrate 110. In one or more exemplary embodiments, the dummy pad 130 may include (or be formed of) materials that are the same as materials included in one of the electromagnetic shielding layer 750 and the cover layer. In this manner, the dummy pad 130 described with reference to FIG. 1 may be formed when the pad unit 120 (or the pads 121) is formed, but the dummy pad 130 included in the flexible printed circuit of FIG. 7 may be formed when one of the electromagnetic shielding layer 750 and the cover layer is formed (or during a process of forming one of the electromagnetic shielding layer 750 and the cover layer). It is noted, however, that exemplary embodiments are not limited thereto or thereby. Further, the dummy pad 130 may include the materials that are the same as materials included in one of the electromagnetic shielding layer 750 and the cover layer such that an electromagnetic shielding of the flexible printed circuit 700 may be enhanced.

Figure 8:
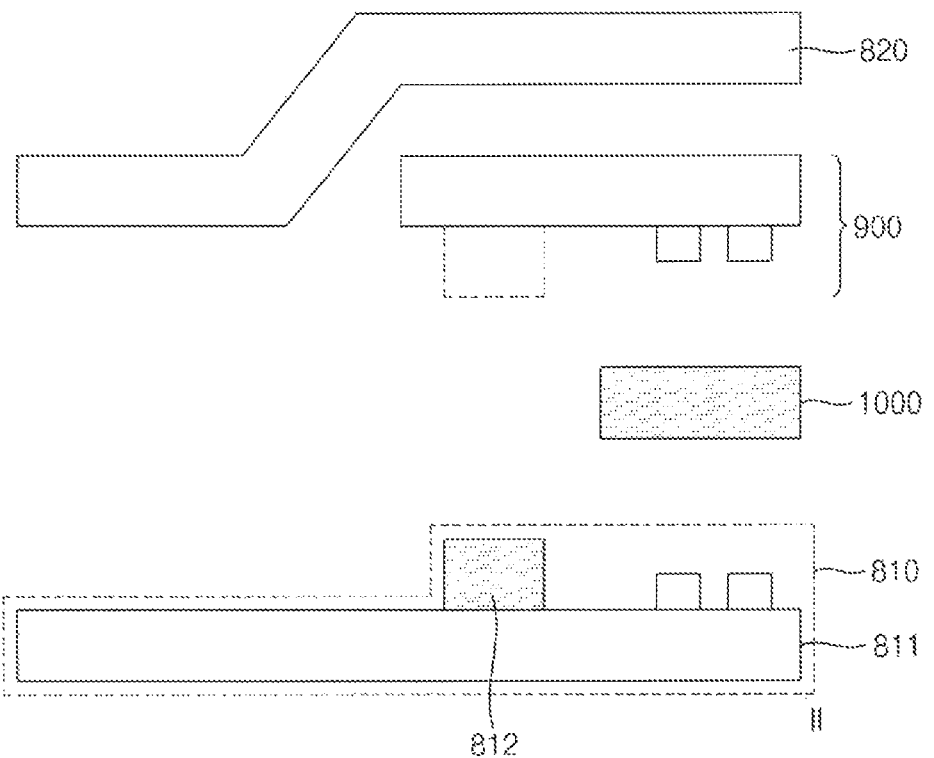
FIG. 8 is a cross-sectional view of a display device, according to one or more exemplary embodiments.

FIG. 8 is a cross-sectional view of a display device, according to one or more exemplary embodiments.

Referring to FIGS. 1, 3A, 3B, and 8, the display device 800 may include a first substrate 810, a flexible printed circuit 900, and a film 820. The first substrate 810, the flexible printed circuit 900, and the film 820 may be the same as or substantially similar to the first substrate 210, a flexible printed circuit 100, and a film 220 described in association with FIG. 3B. As such, duplicative descriptions are omitted to avoid obscuring exemplary embodiments.

The flexible printed circuit 900 may not include a dummy pad as compared to the flexible printed circuit 100 illustrated in FIG. 3B, and the first substrate 810 may include a dummy bump 812 on main body portion 811 as compared to the first substrate 210 illustrated in FIG. 3B. The flexible printed circuit 900 may be attached on the first substrate 810 through an adhesive layer 1000, and the film 820 may attached on the first substrate 810 (and the flexible printed circuit 900). A cross-section of the display device of FIG. 8 may be substantially the same as a cross-section of the display device 10 illustrated in FIG. 3B (or FIG. 4C). That is, the first air path AP1 described with reference to FIG. 3B may be formed between the dummy bump 812 of the first substrate 810 and the adhesive layer 1000, and the second air path AP2 described with reference to FIG. 3B may be formed along a boundary of the flexible printed circuit 900 between the dummy bump 812 and the film 820. Generated air bubbles may be discharged to the outside through the first air path AP1 and the second air path AP2.

According to one or more exemplary embodiments, the dummy bump 812 may have a height greater than a height of bumps described with reference to FIGS. 4A, 4B, and 4C or may include dummy patterns having various shapes as described with reference to FIGS. 5A, 5B, and 5C. As such, the air path (e.g., the sixth air path AP6) formed in association with the display device of FIG. 8 may have a maximized cross-sectional area and a shortest distance to the outside via formation of the dummy patterns and may be maintained even though a module process (e.g., an autoclave process) is conducted.

Exemplary embodiments may be applied with respect to any suitable display device, e.g., liquid crystal displays, electrophoretic displays, electrowetting displays, organic light-emitting displays, inorganic electroluminescent displays, field emission displays, surface-conduction electron-emitter displays, plasma displays (PDs), etc. For example, exemplary embodiments may be applied to televisions, digital cameras, media players (e.g., portable media players, MP3 players, etc.), notebook computers, gaming devices, tablets, monitors, navigational aids, pendant devices, billboards, wrist watches, headphones, earpiece devices, consumer appliances, video phones, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
 a first substrate;
 a flexible printed circuit disposed on a first area of the first substrate; and
 a film disposed on the first substrate and the flexible printed circuit,
 wherein the flexible printed circuit comprises:
  a second substrate;
  a pad area comprising pads disposed on the second substrate, the pads extending in a first direction and spaced apart from one another in a second direction crossing the first direction; and
  a dummy pad disposed on the second substrate, the dummy pad being spaced apart from the pad area, and
 wherein:
  the flexible printed circuit further comprises a dummy line extending in the second direction; and
  the dummy line is spaced apart from the pad area in a direction opposite the first direction.

2. The display device of claim 1, wherein:
 a first air path is formed between the dummy pad and the pad area; and
 the first air path is configured to discharge air bubbles disposed between the first substrate and the film to an ambient environment.

3. The display device of claim 2, wherein:
 a second air path is formed along a boundary of the first area between the dummy pad and the film; and
 the second air path is configured to discharge air bubbles disposed between the first substrate and the film to an ambient environment.

4. The display device of claim 1, wherein the dummy pad extends in the first direction and is spaced apart from the pad area in the second direction.

5. The display device of claim 4, wherein a gap between the dummy pad and the pad area is greater than or equal to 0.25 millimeters.

6. The display device of claim 1, wherein heights of the dummy pad and the pads are equivalent to one another.

7. The display device of claim 6, wherein:
the first substrate comprises a support pad; and
the support pad and the dummy pad overlap one another.

8. The display device of claim 1, wherein the dummy pad comprises a height greater than a height of the pads of the pad area.

9. The display device of claim 1, wherein:
the dummy pad comprises first dummy patterns extending in the first direction; and
the first dummy patterns are spaced apart from one another in the first direction.

10. The display device of claim 9, wherein:
the dummy pad comprises second dummy patterns extending in the first direction;
the second dummy patterns are spaced apart from one another in the first direction; and
lengths of the second dummy patterns in the first direction are different from lengths of the first dummy patterns in the first direction.

11. The display device of claim 1, wherein:
the dummy pad comprises an air path formed in a third direction; and
the third direction forms an acute angle with respect to the first direction.

12. The display device of claim 1, wherein:
the dummy pad comprises a dummy pattern extending in the first direction; and
the dummy pattern comprises, at a first portion, a protruded part in the second direction.

13. The display device of claim 12, wherein the protruded part forms an alignment pattern of the flexible printed circuit, the alignment pattern being configured to facilitate alignment of features of the flexible printed circuit.

14. The display device of claim 1, wherein:
the flexible printed circuit further comprises at least one of an electromagnetic shielding layer and a cover layer disposed on the second substrate; and
the dummy pad is formed of a same material as at least one of the electromagnetic shielding layer and the cover layer.

15. The display device of claim 1, wherein the first substrate is a touch sensing layer comprising:
an active area configured to sense a touch interaction; and
the first area outside the active area.

16. A flexible printed circuit comprising:
a substrate;
a pad area comprising pads disposed on the substrate, the pads extending in a first direction and spaced apart from one another in a second direction crossing the first direction;
a dummy pad disposed on the substrate, the dummy pad being spaced apart from the pad area; and
a dummy line extending in the second direction, the dummy line being spaced apart from the pad area in a direction opposite the first direction.

17. The display device of claim 16, wherein:
an air path is formed between the dummy pad and the pad area;
the flexible printed circuit is configured to couple with a film; and
the air path passes through a portion of the flexible printed circuit when coupled to the film via the substrate, the pad area, and the dummy pad.

18. The display device of claim 16, wherein the dummy pad extends in the first direction and is spaced apart from the pad area in the second direction.

19. The display device of claim 16, wherein:
the dummy pad comprises first dummy patterns extending in the first direction; and
the first dummy patterns are spaced apart from one another in the first direction.

20. A display device comprising:
a first substrate;
a flexible printed circuit disposed on a first area of the first substrate;
an adhesive between the first substrate and the flexible printed circuit board; and
a film disposed on the first substrate and the flexible printed circuit,
wherein the flexible printed circuit comprises:
a second substrate;
a pad area comprising pads disposed on the second substrate, the pads extending in a first direction and spaced apart from one another in a second direction crossing the first direction by separation spaces; and
a dummy pad disposed on the second substrate, the dummy pad being spaced apart from the pad area,
wherein the adhesive extends into some of the separation spaces, and
wherein the dummy pad is spaced apart from the adhesive and supports the second substrate on the first substrate to form:
a first air path laterally between the dummy pad and a side of the adhesive; and
a second air path along a boundary of the first area and laterally between the dummy pad and the film.

* * * * *